(12) United States Patent
Sugimoto

(10) Patent No.: US 10,326,416 B2
(45) Date of Patent: Jun. 18, 2019

(54) AMPLIFIER

(71) Applicant: SUMITOMO ELECTRIC INDUSTRIES, LTD., Osaka (JP)

(72) Inventor: Yoshiyuki Sugimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/964,776

(22) Filed: Apr. 27, 2018

(65) Prior Publication Data

US 2018/0316323 A1    Nov. 1, 2018

(30) Foreign Application Priority Data

Apr. 28, 2017   (JP) ................................. 2017-090051

(51) Int. Cl.
*H03F 3/45* (2006.01)
*H03F 1/02* (2006.01)
(Continued)

(52) U.S. Cl.
CPC ....... *H03F 3/45085* (2013.01); *H03F 1/0233* (2013.01); *H03F 1/34* (2013.01); *H03F 3/45094* (2013.01); *H03F 3/45475* (2013.01); *H03F 3/45529* (2013.01); *H03F 3/50* (2013.01); *H03F 3/68* (2013.01); *H03F 2200/126* (2013.01); *H03F 2200/153* (2013.01); *H03F 2200/165* (2013.01); *H03F 2200/21* (2013.01); *H03F 2200/234* (2013.01); *H03F 2200/267* (2013.01); *H03F 2200/303* (2013.01); *H03F 2200/93* (2013.01); *H03F 2203/45021* (2013.01); *H03F 2203/45022* (2013.01); *H03F 2203/45026* (2013.01); *H03F 2203/45146* (2013.01); *H03F 2203/45151* (2013.01);
(Continued)

(58) Field of Classification Search
CPC ......................................................... H03F 3/45
See application file for complete search history.

(56) References Cited

U.S. PATENT DOCUMENTS 4,160,201 A * 7/1979 Ahmed .................... G05F 1/613
                                                323/226
5,367,247 A * 11/1994 Blocher ..................... G05F 1/38
                                                323/222

(Continued)

*Primary Examiner* — Patricia T Nguyen
(74) *Attorney, Agent, or Firm* — Smith, Gambrell & Russell, LLP.

(57) ABSTRACT

An amplifier that amplifies a differential signal includes first and second input terminals for receiving two input signals; first and second diodes each including an anode and a cathode, the anodes being electrically connected to the first and second input terminals; first and second bias current sources being respectively electrically connected to the cathodes of the first and second diodes; an operational amplifier connected to the cathode of the first diode and the cathode of the second diode and configured to amplify a differential signal between signals generated at the cathodes of the first and second diodes; a capacitive element being electrically connected between an input and an output of the operational amplifier; and a differential amplifier provided between the operational amplifier and the first and second input terminals and configured to amplify the two input signals. The first and second bias current sources include a current mirror circuit.

10 Claims, 4 Drawing Sheets

(51) Int. Cl.
*H03F 1/34* (2006.01)
*H03F 3/68* (2006.01)
*H03F 3/50* (2006.01)

(52) U.S. Cl.
CPC .............. *H03F 2203/45154* (2013.01); *H03F 2203/45156* (2013.01); *H03F 2203/45418* (2013.01); *H03F 2203/45548* (2013.01); *H03F 2203/45556* (2013.01); *H03F 2203/45571* (2013.01); *H03F 2203/45578* (2013.01); *H03F 2203/45592* (2013.01); *H03F 2203/45596* (2013.01); *H03F 2203/45671* (2013.01); *H03F 2203/5033* (2013.01)

(56) References Cited

U.S. PATENT DOCUMENTS

| | | | | |
|---|---|---|---|---|
| 5,412,344 | A * | 5/1995 | Franck | H03F 1/086 330/255 |
| 6,166,596 | A * | 12/2000 | Higashiyama | H03F 1/0222 330/10 |
| 7,230,476 | B1 | 6/2007 | Broekaert et al. | |
| 2002/0063598 | A1* | 5/2002 | Huijsing | H03F 1/083 330/257 |
| 2007/0024368 | A1* | 2/2007 | Abdelatty Ali | H03F 3/45188 330/259 |
| 2016/0344355 | A1* | 11/2016 | Siniscalchi | H03F 3/45273 |

\* cited by examiner

AMPLIFIER

TECHNICAL FIELD

An aspect of the present invention relates to an amplifier that amplifies an input signal.

BACKGROUND

An optical receiver for use in an optical communication system includes, for example, a photodetector, a transimpedance amplifier (TIA), and a feedback amplifier (amplifier). As the photodetector, a photodiode is used. The photodetector converts an optical signal into an electrical signal (photocurrent). The TIA converts the photocurrent (a current signal) output from the photodetector into a voltage signal. The feedback amplifier automatically controls an offset of the TIA (automatic offset control). U.S. Pat. No. 7,230,476 discloses a feedback amplifier including a diode, a differential amplifier (operational amplifier), and a capacitor. The diode is reverse-biased and connected between an input terminal of the feedback amplifier and the operational amplifier. The capacitor is connected between an input and an output of the operational amplifier to configure a feedback loop. Large resistance of the reverse-biased diode and large capacitance of the feedbacked capacitor provides a low pass filter with a low cutoff frequency. The low pass filter stabilizes automatic control of an offset of the feedback amplifier. Further increasing of an input impedance of the feedback amplifier to lower the cutoff frequency reduces an input current of the operational amplifier. The differential amplifier with a Darlington connection has the advantage of amplifying such a small input current, but requires a relatively large supply voltage that prevents the differential amplifier from reducing power dissipation thereof.

SUMMARY

An amplifier according to an aspect of the present invention is an amplifier that amplifies a differential signal between two input signals, and includes a first input terminal for receiving one of the two input signals; a second input terminal for receiving another of the two input signals; a first diode having an anode and a cathode, the anode being electrically coupled to the first input terminal; a second diode having an anode and a cathode, the anode being electrically coupled to the second input terminal; a first bias current source electrically connected to the cathode of the first diode, the first bias current source being configured to supply a first current to the first diode element; a second bias current source electrically connected to the cathode of the second diode, the second bias current source being configured to supply a second current to the second diode element; an operational amplifier including a non-inverting input, an inverting input, and a non-inverting output, the non-inverting input being connected to the cathode of the first diode, the inverting input being connected to the cathode of the second diode, the operational amplifier being configured to amplify a differential signal between a signal generated at the cathode of the first diode and a signal generated at the cathode of the second diode, the non-inverting output being configured to output an amplified differential signal; a feedback capacitive element electrically connected between the inverting input and the non-inverting output of the operational amplifier; and a differential amplifier being provided between the operational amplifier and the first input terminal and the second input terminal, the differential amplifier including a bipolar transistor pair amplifying the two input signals, wherein the first and second bias current sources include a current mirror circuit.

DETAILED DESCRIPTION

Figure 1:
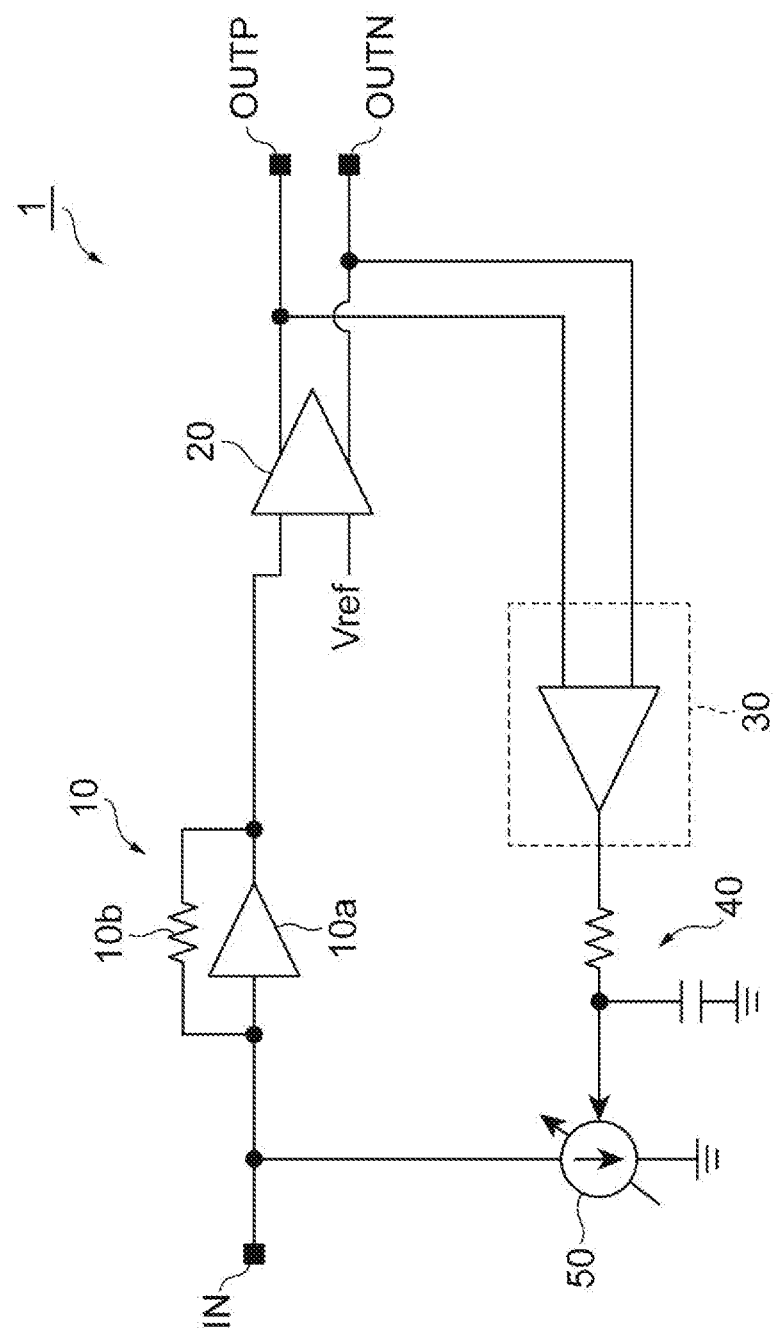
FIG. 1 is a circuit diagram of a transimpedance amplifier including an amplifier according to an embodiment.

Hereinafter, an embodiment of the present invention will be described with reference to the drawings. In the description of the drawings, the same elements are denoted by the same reference numerals, and duplicate description thereof is omitted.

FIG. 1 is a circuit diagram of a transimpedance amplifier including an amplifier according to an embodiment. The transimpedance amplifier 1 illustrated in FIG. 1 is used for an optical receiver in an optical communication system. The transimpedance amplifier 1 is a circuit that converts a current signal (photocurrent) output from a photodetector into a voltage signal. The photodetector is, for example, a photodiode. The transimpedance amplifier 1 includes an input terminal IN, a conversion circuit 10, a differential amplifier 20, a feedback amplifier (an amplifier) 30, a low pass filter 40, a current source (a bypass circuit) 50, and output terminals OUTP and OUTN.

The conversion circuit 10 includes an amplifier 10a and a resistive element 10b. The input terminal IN is electrically connected to an input of the amplifier 10a, and the resistive element 10b is connected between the input and an output of the amplifier 10a. The amplifier 10a is, for example, an inverting amplifier circuit. The resistive element 10b feeds back an output signal of the amplifier 10a to the input of the amplifier 10a. The conversion circuit 10 converts the input current signal into a voltage signal. The input current signal is described later The differential amplifier 20 includes two inputs and two outputs. One input (for example, an inverting input) of the differential amplifier 20 is electrically connected to the output of the amplifier 10a and receives the voltage signal from the amplifier 10a. A reference voltage Vref is input to another input (for example, a non-inverting input) of the differential amplifier 20. One output (for example, a non-inverting output) of the differential amplifier is electrically connected to the output terminal OUTP. Another output (for example, an inverting output) of the differential amplifier is electrically connected to the output terminal OUTN. The differential amplifier 20 amplifies a differential signal and outputs a differential output signal to the output terminals OUTP and OUTN. The differential signal corresponds to a difference in voltage between the voltage signal output from the conversion circuit 10 and the reference voltage Vref. For example, the signal output from the output terminal OUTP is a positive phase component (a positive phase signal) of the differential output signal, and the signal output from the output terminal OUTN is a negative phase component (a negative phase signal) of the differential output signal. The positive phase signal has a phase opposite to a phase of the negative phase signal. That is, when the positive phase signal increases, the negative phase signal decreases, and conversely, when the positive phase signal decreases, the negative phase signal increases. In addition, when one of the signals has a peak value (or a high level of a binary signal), another has a bottom value (or a low level of the binary signal). An amplitude of the positive phase signal is substantially equal to an amplitude of the negative phase signal.

The feedback amplifier 30 amplifies the differential output signal and outputs the amplified differential signal as a control signal for the current source 50 (a bypass circuit) via the low pass filter 40.

The current source 50 generates a variable current (a bypass current) according to the amplified differential signal generated by the feedback amplifier 30, and subtracts (bypasses) the bypass current from the input current (the photocurrent) input to the input terminal IN. A remainder after subtracting the bypass current from the input current (the photocurrent) is the above-mentioned input current signal. The input current signal is input to the conversion circuit 10.

With such a circuit configuration, automatic offset control for reducing an offset (an output offset) between the positive phase signal and the negative phase signal output from the output terminals OUTP and OUTN is provided. Here, reducing the output offset in the transimpedance amplifier 1 and amplifying a broadband signal requires a large gain of the feedback amplifier 30 (for example, to 60 dB or more) and a lower cutoff frequency thereof (for example, to about 10 to 100 Hz).

Figure 2:
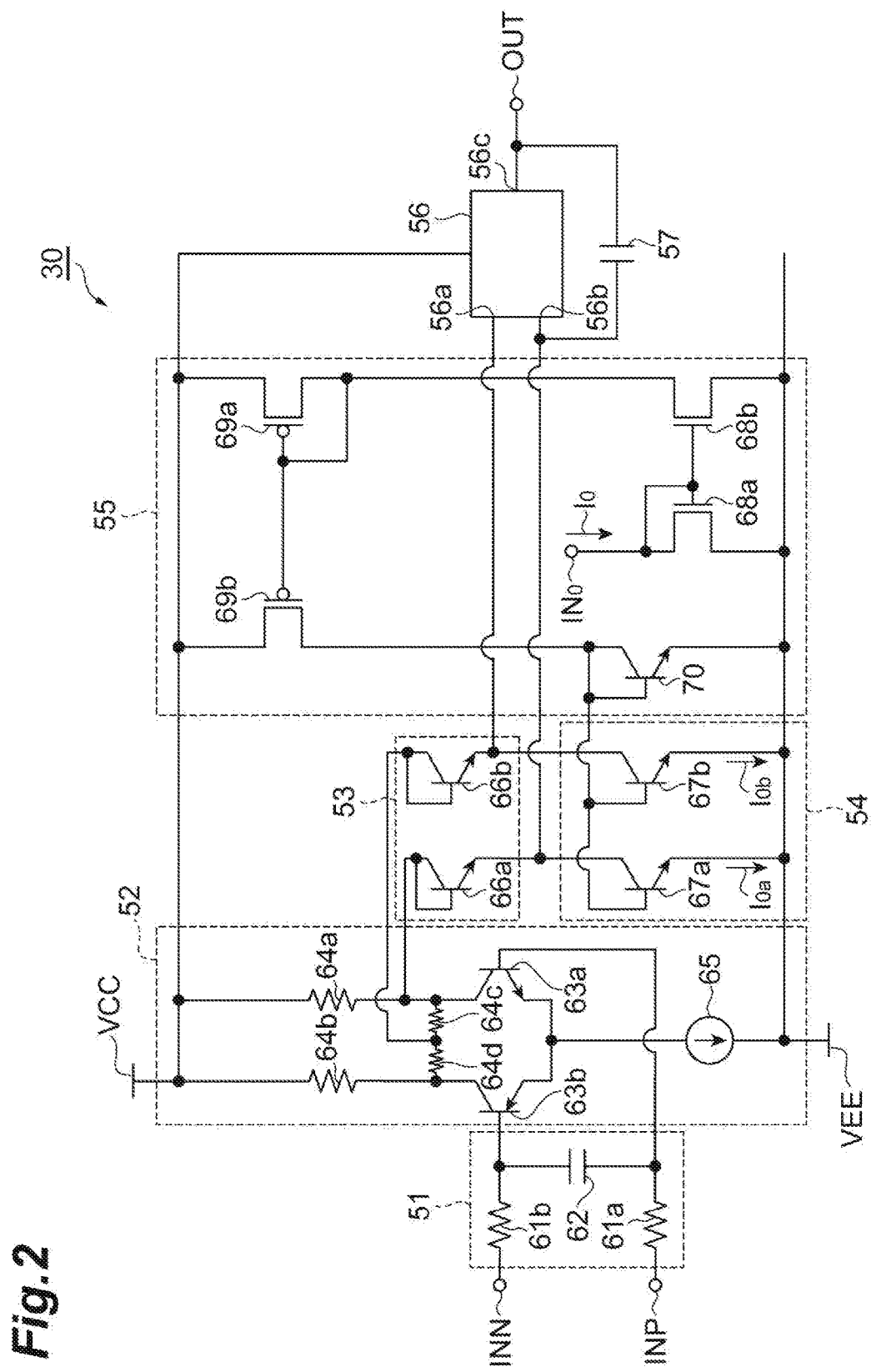
FIG. 2 is a circuit diagram illustrating a detailed configuration of the amplifier according to the embodiment.

Next, a detailed configuration of the feedback amplifier 30 will be described. FIG. 2 is a circuit diagram illustrating a configuration of the feedback amplifier 30 according to the embodiment. The feedback amplifier 30 illustrated in FIG. 2 is, for example, a circuit formed through a semiconductor process for SiGe bipolar complementary metal oxide semiconductor (BiCMOS). The feedback amplifier 30 includes input terminals INP and INN, an output terminal OUT, an input filter 51, a differential amplifier 52, a diode pair 53, a bias current source 54, a current mirror circuit portion 55, an operational amplifier 56, and a capacitive element (miller capacitance) 57.

The input terminals INP and INN receive a differential signal. For example, the input terminal INP receives a positive phase component (a positive phase signal) of the differential signal, and the input terminal INN receives a negative phase component (a negative phase signal) of the differential signal.

The input filter 51 is, for example, an RC filter including a resistive element and a capacitor. The RC filter is a low pass filter.

The output terminal OUT outputs an output signal generated according to a difference between the positive phase signal input to the input terminal INP and the negative phase signal input to the input terminal INN. The output signal may be a positive phase component of a differential output signal output from the operational amplifier.

The input filter 51 is provided between the input terminals INP and INN and the diode pair 53. The input filter 51 includes, for example, resistive elements 61a and 61b and a capacitive element 62. One end of the resistive element 61a is electrically connected to the input terminal INP, and one end of the resistive element 61b is electrically connected to the input terminal INN. The capacitive element 62 is electrically connected between another end of the resistive element 61a and another end of the resistive element 61b.

The input filter 51 functions as a low pass filter that passes low-frequency components of the positive phase signal and the negative phase signal.

The differential amplifier 52 is, for example, a differential amplifier including a bipolar transistor pair. The differential amplifier 52 is provided between the operational amplifier 56 and the input terminals INP and INN. The differential amplifier 52 includes, for example, bipolar transistors 63a and 63b, resistive elements 64a, 64b, 64c, and 64d, and a current source 65. A base of the bipolar transistor 63a is electrically connected to the other end of the resistive element 61a. A collector of the bipolar transistor 63a is electrically connected to a supply line (a first supply line) via a resistive element 64a, and a positive supply voltage VCC (a first supply voltage) is applied to the collector. A base of the bipolar transistor 63b is electrically connected to the other end of the resistive element 61b. A collector of the bipolar transistor 63b is electrically connected to the supply line via the resistive element 64b and the supply voltage VCC is applied thereto. Further, the respective emitters of the bipolar transistors 63a and 63b are electrically connected to one end of the current source 65. Another end of the current source 65 is electrically connected to the-supply line (a second supply line), and a negative power supply voltage VEE (a second supply voltage) is applied thereto. It should be noted that the other end of the current source 65 may be electrically connected to a ground line in place of the negative power supply voltage VEE.

This differential amplifier 52 amplifies the difference (the differential signal) in voltage between the positive phase signal and the negative phase signal each passing through the input filter 51 and outputs the negative phase signal of the amplified differential signal from the collector of the transistor 63a. One end of the resistive element 64c is electrically connected to the collector of the transistor 63a, and one end of the resistive element 64d is electrically connected to the collector of the transistor 63b. The respective other ends of the resistive elements 64c and 64d are connected to each other and output an average value of the negative phase signal output from the collector of the transistor 63a and the positive phase signal output from the collector of the transistor 63b.

A positive phase signal is input from the input terminal INP to the base of the transistor 63a via the resistive element 61a. When a voltage of the positive phase signal increases and the transistor 63a turns on, a collector current flows, a voltage drop of the resistive element 64a increases, and a potential of the collector of the transistor 63a decreases (falls). Therefore, a signal output from the collector of the transistor 63a corresponds to a signal obtained by inverting the signal input to the base of the transistor 63a. For example, when the positive phase signal is input to the base of the transistor 63a, the signal output from the collector of the transistor 63a corresponds to the negative phase signal.

On the other hand, the negative phase signal is input from the input terminal INN to the base of the transistor 63b via the resistive element 61b. When a voltage of the negative phase signal increases and the transistor 63b turns on, a collector current flows, a voltage drop of the resistive element 64b increases, and a potential of the collector of the transistor 63b decreases (falls). Therefore, a signal output from the collector of the transistor 63b corresponds to a signal obtained by inverting the signal input to the base of the transistor 63b. For example, when the negative phase signal is input to the base of the transistor 63b, the signal output from the collector of the transistor 63b corresponds to the positive phase signal. Accordingly, the differential amplifier 52 behaves like an inverting amplifier in the configuration.

It should be noted that the resistive elements 64c and 64d are set to have the same resistance value. With such a configuration, the collector of the transistor 63b generates the positive phase signal that has a phase opposite to a phase of the negative phase signal output from the collector of the transistor 63a. Therefore, the other ends of the resistive elements 64c and 64d connected to each other generate an intermediate potential between the positive phase signal and the negative phase signal, which corresponds to the average value of the positive phase signal and the negative phase signal.

It should be noted that a smaller voltage difference between the supply voltage VCC and the supply voltage VEE causes a lower power dissipation of the amplifier 30, and therefore, in order to reduce the power dissipation of the amplifier 30, it is preferable for the voltage difference between the supply voltage VCC and the power supply voltage VEE to be set to a smaller value as long as the amplifier 30 operates normally.

The diode pair 53 includes two bipolar transistors 66a and 66b. A base and a collector of the bipolar transistor 66a are electrically connected to the collector of the bipolar transistor 63a in common. Further, a base and a collector of the bipolar transistor 66b are electrically connected to the other ends of the resistive elements 64c and 64d in common. The bipolar transistors 66a and 66b both behave as diode elements due to a connection form (a diode connection) in which a base of a certain bipolar transistor is connected to a collector of the bipolar transistor as described above, the base and the collector of the bipolar transistors 66a and 66b function as an anode of the diode element, and an emitter of the bipolar transistors 66a and 66b functions as a cathode of the diode element. When a minute current is supplied from the bias current source 54 to the bipolar transistors 66a and 66b, the bipolar transistors 66a and 66b provide high resistances like reversed-biased diode elements.

An emitter of the bipolar transistor 66a outputs a voltage signal shifted downward from the negative phase signal output from the bipolar transistor 63a by a voltage drop generated between the collector and the emitter of the bipolar transistor 66a. Further, an emitter of the bipolar transistor 66b outputs a voltage signal shifted downward from the average value output from the other end of the resistive elements 64c and 64d by a voltage drop generated between the collector and the emitter of the bipolar transistor 66b. It should be noted that the bipolar transistors 66a and 66b are set to have the same electrical characteristics for providing the same voltage drop.

The bias current source 54 includes two bipolar transistors 67a and 67b. A collector of the bipolar transistor 67a is electrically connected to the emitter (corresponding to the cathode of the diode) of the bipolar transistor 66a. The supply voltage VEE is applied to the emitter of the bipolar transistor 67a. A collector of the bipolar transistor 67b is electrically connected to the emitter (corresponding to the cathode of the diode) of the bipolar transistor 66b. The supply voltage VEE is applied to an emitter of the bipolar transistor 67b. The bipolar transistors 67a and 67b operate as bias current sources. The bipolar transistors 67a supplies a minute current that flows from the collector to the emitter of the bipolar transistors 66a with the diode connection. The bipolar transistors 67b supplies a minute current that flows from the collector to the emitter of the bipolar transistors 66b with the diode connection. Each minute current is adjusted in accordance with a control signal generated by the current mirror circuit portion 55 by connecting bases of the bipolar transistors 67a and 67b to a base of a bipolar transistor 70 in the current mirror circuit portion 55.

It should be noted that the voltage of the supply voltage VEE (a second supply voltage) may be lower than the voltage of the supply voltage VCC (a first supply voltage), and does not necessarily have to be a negative voltage. For example, when the supply voltage VCC is positive, the supply voltage VEE may be a ground potential.

The current mirror circuit portion 55 includes a pair of transistors 68a and 68b which are n-type metal oxide semiconductor field effect transistors (MOSFETs), a pair of transistors 69a and 69b which are p-type MOSFETs, and a bipolar transistor 70.

A gate and a drain of the transistor 68a are connected to an input terminal $IN_0$ in common, and the supply voltage VEE is applied to a source of the transistor 68a. A reference current $I_0$ is input from the outside to the input terminal $IN_0$ (a current setting terminal). A gate of the transistor 68b is electrically connected to the gate and the drain of the transistor 68a to constitute a current mirror circuit (first current mirror circuit). The supply voltage VEE is applied to a source of the transistor 68b.

Further, a gate and a drain of the transistor 69a are electrically connected to the drain of the transistor 68b in common. The supply voltage VCC is applied to a source of the transistor 69a. A gate of the transistor 69b is electrically connected to the gate and the drain of the transistor 69a to constitute another current mirror circuit (second current mirror circuit). The supply voltage VCC is applied to a source of the transistor 69b.

In addition, a base and a collector of the bipolar transistor 70 are electrically connected to the drain of the transistor 69b in common. The supply voltage VEE is applied to an emitter of the bipolar transistor 70. Further, the base and the collector of the bipolar transistor 70 are also connected to the bases of the bipolar transistors 67a and 67b of the bias current source 54 to duplicate the respective minute currents from a collector current (mirror current) of the bipolar transistor 70.

In the current mirror circuit portion 55 having such a configuration, a first current mirror circuit is constituted by the transistors 68a and 68b. A second current mirror circuit is constituted by the transistors 69a and 69b. A third current mirror circuit is constituted by the bipolar transistor 70 and each of the bipolar transistors 67a and 67b. As a result, a three-stage current mirror circuit is configured. Specifically, the minute currents $I_{0a}$ and $I_{0b}$ corresponding to a size ratio between the transistors 68a and 68b, a size ratio between the transistors 69a and 69b, and a size ratio between the bipolar transistor 70 and the bipolar transistors 67a and 67b are generated between the collector and the emitter of the bipolar transistors 67a and 67b in response to the reference current $I_0$ by the current mirror circuit portion 55.

For example, when the size ratio of the transistor 68a to the transistor 68b is set to p:1 (p is a positive real number), the size ratio of the transistor 69a to the transistor 69b is set to q:1 (q is a positive real number), and the size ratio of the bipolar transistor 70 to each of the bipolar transistors 67a and 67b is set to r:1 (r is a positive real number), a direct current having a magnitude $1/(p \times q \times r)$ times as large as the reference current $I_0$ is supplied to each of the bipolar transistors 66a and 66b with respective diode connections. In particular, it is preferable for the size ratios to be set such that p, q, and r are real numbers greater than 1 to generate a minute current. Thus, the current mirror circuit portion 55 causes a minute current based on a current value of the reference current $I_0$ and the size ratios of the current mirror circuits. In the case of MOSFETs, the size ratio can be easily set by using a gate width ratio of the respective MOSFETs.

The operational amplifier 56 is, for example, a differential amplifier (an operational amplifier) comprised of a complementary metal-oxide-semiconductor (CMOS) circuit. The operational amplifier 56 is a circuit portion that amplifies a difference (a differential signal) in voltage between the signals input to two input terminals 56a and 56b and outputs the amplified difference in voltage from an output terminal 56c. In the operational amplifier 56, the input terminal 56a (a non-inverting input terminal) is connected to the emitter (the cathode) of the bipolar transistor 66b with the diode connection in the diode pair 53. The input terminal 56b (an inverting input terminal) is connected to the emitter (the cathode) of the bipolar transistor 66a with the diode connection in the diode pair 53. The output terminal 56c is electrically connected to the output terminal OUT of the feedback amplifier 30. With such a configuration, the operational amplifier 56 amplifies the differential signal between the negative phase signal generated at the cathode of one of the diode pair 53 and the average value generated at the cathode of another of the diode pair 53 with a high gain and outputs a resultant signal.

The capacitive element (Miller capacitive element) 57 is connected between the output terminal 56c and the input terminal 56b (the inverting input terminal) of the operational amplifier 56. Here, the signal output from the output terminal 56c is a signal obtained by performing inverting amplification on the signal input to the input terminal 56b. For example, when the signal input to the input terminal 56b increases, the signal output from the output terminal 56c decreases, and reversely, when the signal input to the input terminal 56b decreases, the signal output from the output terminal 56c increases. The capacitive element 57 is connected between the input terminal and the output terminal in which the inverting amplification is performed in this manner. Connecting the capacitive element 57 in this manner allows the operational amplifier 56 to equivalently obtain a large capacitance value (Miller capacitance) due to a Miller effect, as will be described below. A low pass filter that passes only low frequency components of the input signal is configured in a combination of the capacitive element 57 having the Miller capacitance and the diode pair 53 functioning as a resistive element with high resistance.

According to the feedback amplifier 30 described above, the positive phase signal and the negative phase signal input to the input terminals INP and INN are input to the operational amplifier 56 comprised of a CMOS circuit in which the capacitive element 57 is connected between the input and the output thereof, via the differential amplifier 52 including the bipolar transistor pair and the diode pair 53 in which the minute current flows from the anode to the cathode. As a result, the differential signal between the positive phase signal and the negative phase signal is amplified with a large gain and output by the operational amplifier 56. In this case, an input offset is reduced by the differential amplifier 52 including the bipolar transistor pair being connected to the input terminals INP and INN. Specifically, if the feedback amplifier 30 has no differential amplifier 52, the input offset of the feedback amplifier 30 becomes relatively large due to mismatch (characteristic variation) between threshold voltages of the MOSFETs of the CMOS circuit constituting the operational amplifier 56. On the other hand, as the feedback amplifier 30 includes the differential amplifier 52, the input offset of the feedback amplifier 30 is caused by mismatch (for example, manufacturing variation) between base-emitter voltages VBE of the NPN bipolar transistor pair of the differential amplifier 52, but this mismatch is smaller than the mismatch between the threshold voltages of the CMOS. Therefore, the feedback amplifier 30 allows the input offset thereof to be more reduced. Specifically, for example, the input offset can be reduced from about 50 mV to about several mV by including the differential amplifier 52. In addition, since the diode pair 53 and the capacitive element 57 constitute a low pass filter with a low cutoff frequency. The low pass filter allows automatic offset control to be stably performed when the transimpedance amplifier 1 amplifies a broadband signal.

In addition, according to such a configuration, lowering the supply voltage (a voltage difference between the supply voltage VCC and the power supply voltage VEE) allows the power dissipation to be reduced. For example, a supply current of the feedback amplifier 30 flowing from a supply line for the supply voltage VCC to a supply line for the supply voltage VEE is equal to a sum of currents flowing through the current source 65, the bias current source 54, and the current mirror circuit portion 55. The currents flowing through the current source 65, the bias current source 54, and the current mirror circuit portion 55 do not depend much on the voltage difference between the supply voltage VCC and the supply voltage VEE or the currents become smaller as the voltage difference becomes smaller. Therefore, the power dissipation that is calculated by multiplying the supply voltage difference by the sum of the supply currents is reduced by lowering the supply voltage.

Further, in the feedback amplifier 30 described above, the input filter 51 is provided between the input terminals INP and INN and the diode pair 53. With such a configuration, the automatic offset control can be more stable, as the input filter 51 has a sufficient low cutoff frequency for a broadband input signal. Further, in the feedback amplifier 30, since the diode pair 53 acts as a peak hold circuit for the input signal, an offset may be generated, but this offset is reduced by providing the input filter 51.

In addition, the minute current is supplied to the diode pair 53 by the current mirror circuit having a three-stage configuration. In this case, since the minute current is supplied to the diodes (the bipolar transistors 66a and 66b with the diode connections) included in the diode pair 53 such that the reverse-biased diodes provides a large resistance, and circuit elements having a Darlington connection that needs a relatively high supply voltage are removable, power dissipation of the feedback amplifier 30 can be reduced.

Here, an example of the cutoff frequency in the feedback amplifier 30 of the embodiment will be shown. First, when a capacitance value of the capacitive element 57 alone is C and a voltage gain of the operational amplifier 56 is −A (the negative value means the inverting amplification), a miller capacitance Cm of the capacitive element 57 in the operational amplifier 56 is calculated as Cm=C×(1+A). Accordingly, when the voltage gain is set to 60 dB (corresponding to A=1000) and the capacitance value C is set to 50 pF, the miller capacitance Cm becomes approximately 50 nF. Next, when a resistance value of one of the diodes is R, the cutoff frequency fc is estimated as in the following equation:

$$fc=1/(2\pi \cdot R \cdot Cm)$$

Accordingly, when the resistance value R is set 500 KΩ, the resistance value R=500 KΩ and the miller capacitance Cm=50 nF make the cutoff frequency fc≈6 Hz. The capacitance value C=50 pF of the capacitive element 57 is a typical value available on a semiconductor chip using metal-insulator-metal (MIM) capacitance. In a case in which the feedback amplifier 30 is used for negative feedback in the transimpedance amplifier as illustrated in FIG. 1, it is preferable for the voltage gain A, the capacitance value C, and the resistance value R to be set such that fc falls within a range of 10 to 100 Hz. The cutoff frequency fc≈6 Hz is a sufficient value.

Further, advantageous effects obtained by adopting the feedback amplifier 30 in the embodiment will be described through a comparison with a comparative example.

Figure 4:
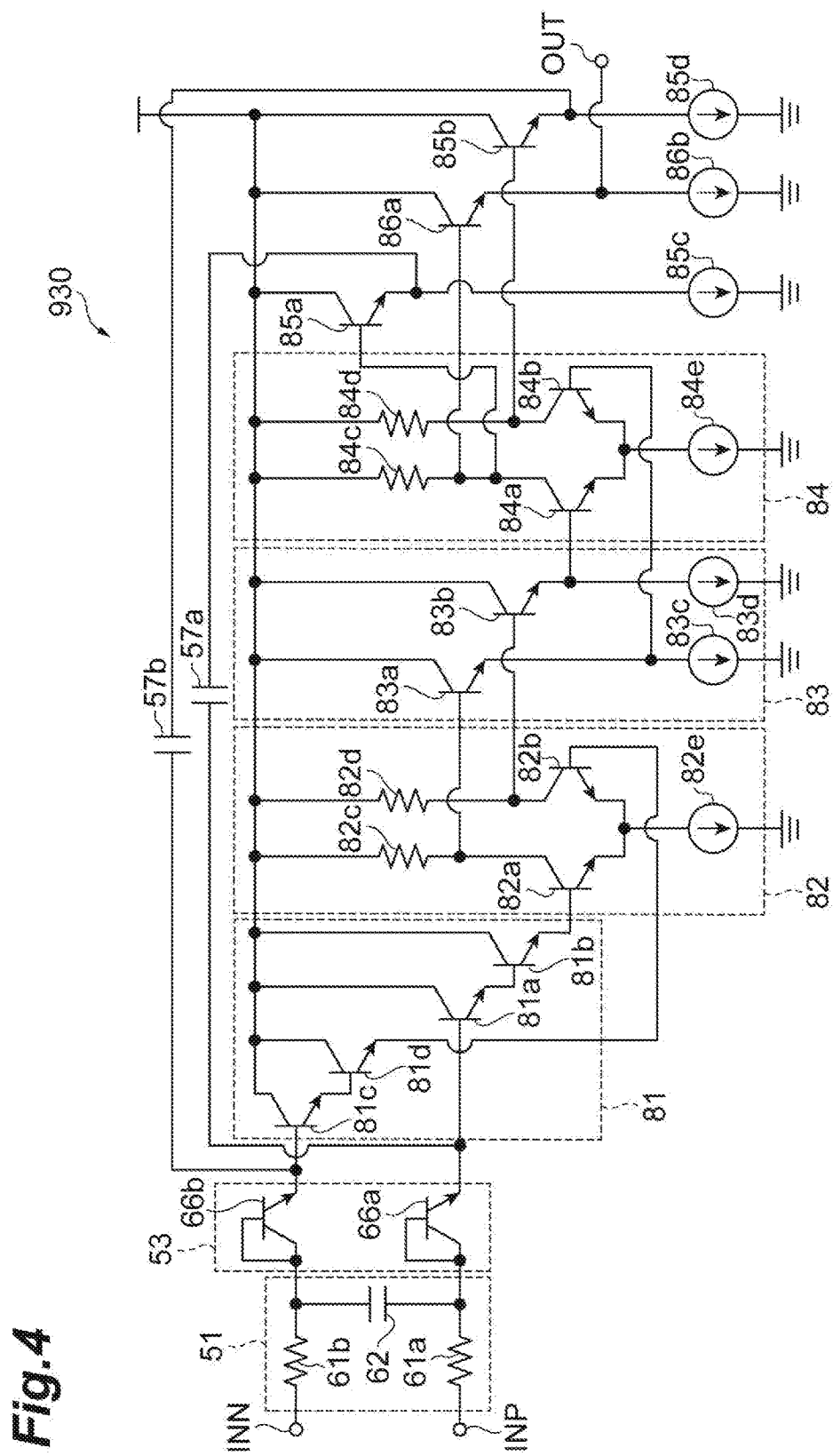
FIG. 4 is a circuit diagram of an amplifier according to a comparative example.

FIG. 4 is a circuit diagram illustrating a configuration of a feedback amplifier 930 according to a comparative example. The feedback amplifier 930 according to the comparative example illustrated in FIG. 4 is a circuit formed through a semiconductor process for an InP heterojunction bipolar transistor (HBT). The feedback amplifier 930 does not include the differential amplifier 52 between the input filter 51 and the diode pair 53, but includes a Darlington-connected bipolar transistor pair 81 as a circuit portion that supplies the minute current to the diode pair 53, and includes two stages of differential amplifiers 82 and 84 in order to differentially amplify two input signals (a differential input signal), unlike the feedback amplifier 30.

Specifically, the bipolar transistor pair 81 includes two sets of two-stage Darlington-connected configuration. The bipolar transistors 81a and 81b constitute one of the two sets and bipolar transistors 81c and 81d constitute another of the two sets. A set of bipolar transistors 81a and 81b are provided between an emitter of a bipolar transistor 66a and one input of a differential amplifier 82. A pair of bipolar transistors 81c and 81d are provided between an emitter of a bipolar transistor 66b and another input of the differential amplifier 82. In the transistors 81a and 81b which are Darlington-connected in a two-stage configuration, a base of the transistor 81a is electrically connected to the emitter of the transistor 66a, an emitter of the transistor 81a is electrically connected to a base of the transistor 81b (the first stage), and an emitter of the transistor 81b is electrically connected to a base of a transistor 82a (the second stage).

A potential difference greater than 0.6 to 0.8 V is required between the base and the emitter of each of the transistors 81a, 81b, and 82a, and a collector of the transistor 81a is required to be set to a higher potential than that of the base of the transistor 81a. Therefore, such a two-stage Darlington-connection (the transistors 81a and 81b) connected to a differential amplifier (the differential amplifier 82) requires a large supply voltage to secure proper operation.

The differential amplifier 82 includes a pair of bipolar transistors 82a and 82b, resistive elements 82c and 82d provided on collector sides of the bipolar transistors 82a and 82b, and a current source 82e connected to emitters of the bipolar transistors 82a and 82b. Similarly, a differential amplifier 84 includes a pair of bipolar transistors 84a and 84b, resistive elements 84c and 84d provided on collector sides of the bipolar transistors 84a and 84b, and a current source 84e connected to emitters of the bipolar transistors 84a and 84b.

The differential amplifiers 82 and 84 are connected in series at a stage after the Darlington-connected bipolar transistor pair 81, with an emitter follower circuit 83 interposed therebetween.

The emitter follower circuit 83 includes a circuit portion including a bipolar transistor 83a and a current source 83c and a circuit portion including a bipolar transistor 83b and a current source 83d. A base of the bipolar transistor 83a is electrically connected to one output of the differential amplifier 82. An emitter the bipolar transistor 83a is electrically connected to one-input of differential amplifier 84. A base of the bipolar transistor 83b is electrically connected to another output of the differential amplifier 82. An emitter the bipolar transistor 83b is electrically connected to another input of differential amplifier 84.

Further, the feedback amplifier 930 includes capacitive elements (miller capacitances) 57a and 57b. One end of the capacitive element 57a is connected to one output of the differential amplifier 84 via an emitter follower circuit including a bipolar transistor 85a and a current source 85c, and another end of the capacitive element 57a is connected to the base of the bipolar transistor 81a. One end of the capacitive element 57b is connected to the other output of the differential amplifier 84 via an emitter follower circuit including a bipolar transistor 85b and a current source 85d, and another end of the capacitive element 57b is connected to the base of the bipolar transistor 81c.

The one output of the differential amplifier 84 is connected to an output terminal OUT via an emitter follower circuit including a bipolar transistor 86a and a current source 86b.

In the comparative example having the above configuration, since the diode pair 53 supplies a minute current to the Darlington-connected transistor pair 81 in which two transistors are vertically stacked, a large supply voltage is required as described above. Further, since high-gain differential amplification is implemented by using two stages of differential amplifiers in which the currents supplied by the current sources 82e and 84e constantly flow, it is difficult to greatly reduce current dissipation. As a result, the power dissipation of the feedback amplifier 930 tends to increase as compared with the configuration of the embodiment.

It should be noted that the present invention is not limited to the above-described embodiment.

Figure 3:
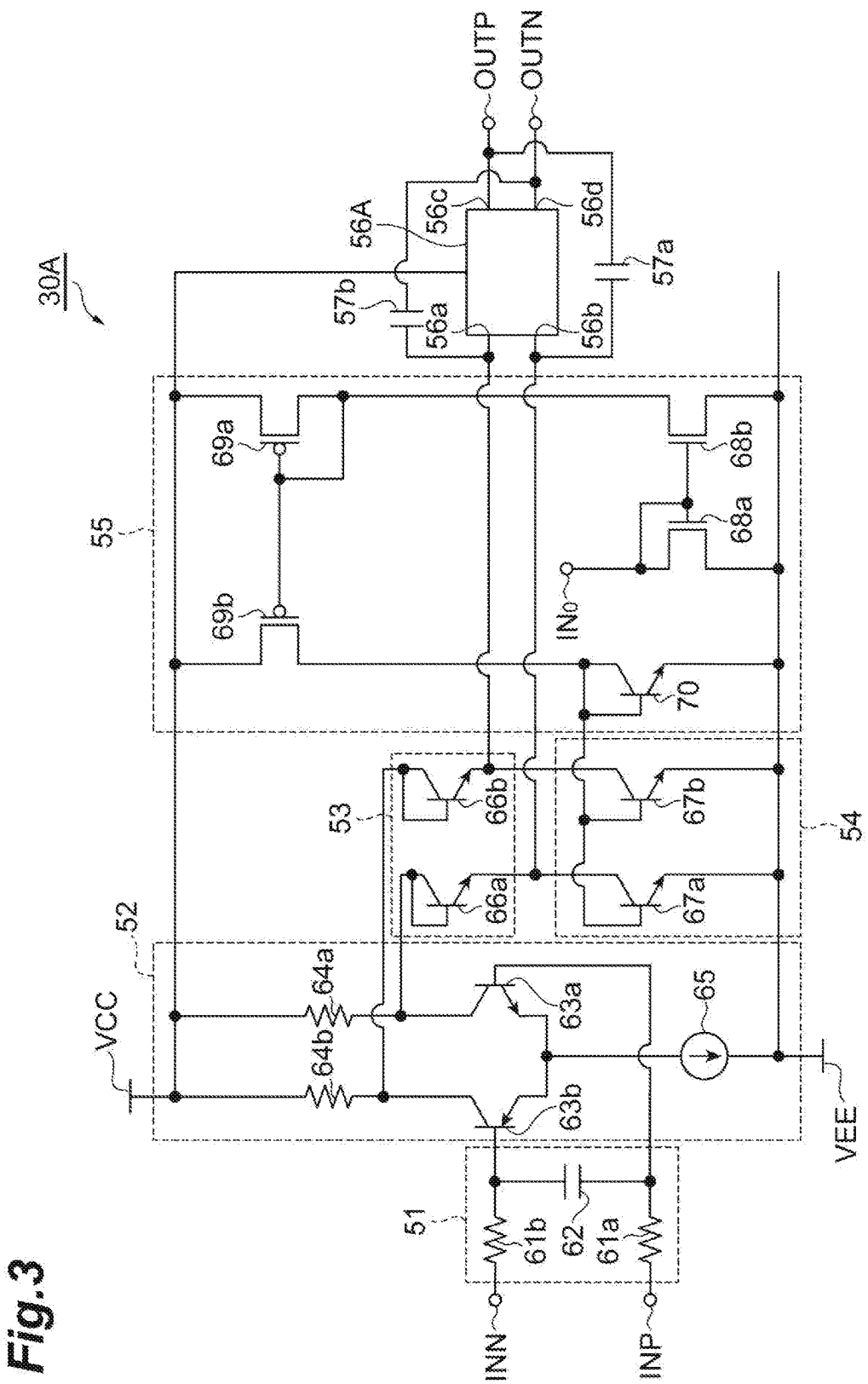
FIG. 3 is a circuit diagram illustrating a detailed configuration of an amplifier according to a variation of the amplifier according to the embodiment.

FIG. 3 is a circuit diagram illustrating a configuration of a variation of the amplifier according to the embodiment. The feedback amplifier 30A illustrated in FIG. 3 is different from the feedback amplifier 30 illustrated in FIG. 2 in that a differential amplifier 52 amplifies a differential signal between two input signals (a positive phase signal and a negative phase signal) input to input terminals INP and INN and outputs a positive phase signal and a negative phase signal of the amplified differential signal, and in that an operational amplifier 56A having a differential output is included. It should be noted that in FIG. 3, the resistive elements 64c and 64d illustrated in FIG. 1 are omitted since the average value of the positive phase signal and the negative phase signal amplified by the differential amplifier 52 are not output.

The operational amplifier 56A includes two output terminals 56c and 56d, amplifies a differential signal between signals input to two input terminals 56a and 56b to generate two complementary signals of which phases are inverted from each other, and outputs the complementary signals from output terminals OUTP and OUTN via output terminals 56c and 56d, respectively.

Further, the feedback amplifier 30A includes two capacitive elements 57a and 57b corresponding to a differential output configuration. The capacitive element 57a is connected between an output terminal 56c and an input terminal 56b of an operational amplifier 56A, and the capacitive element 57b is connected between an output terminal 56d and an input terminal 56a of the operational amplifier 56A. Thus, an output terminal for outputting the inverted and amplified signal is connected to the inverting amplification input terminal via the capacitive element 57a (or 57b), such that large Miller capacitance can be obtained.

The variation of the amplifier according to the embodiment provides stable automatic offset control for amplification of a broadband signal and reduced power dissipation as a result of lowering the power supply voltage.

Although the principle of the invention has been illustrated and described in the preferred embodiment, it will be appreciated by those skilled in the art that the present invention may be changed in an arrangement and details without departing from a such principle. The present invention is not limited to the specific configuration disclosed in the embodiment. Accordingly, all modifications and changes within the scope of the claims and the spirit thereof are claimed.

What is claimed is:

1. An amplifier that amplifies a differential signal between two input signals, the amplifier comprising:
    a first input terminal for receiving one of the two input signals;
    a second input terminal for receiving another of the two input signals;
    a first diode having an anode and a cathode, the anode being electrically coupled to the first input terminal;
    a second diode having an anode and a cathode, the anode being electrically coupled to the second input terminal;
    a first bias current source electrically connected to the cathode of the first diode, the first bias current source being configured to supply a first current to the first diode;
    a second bias current source electrically connected to the cathode of the second diode, the second bias current source being configured to supply a second current to the second diode;
    an operational amplifier including a non-inverting input, an inverting input, and a non-inverting output, the non-inverting input being connected to the cathode of the first diode, the inverting input being connected to the cathode of the second diode, the operational amplifier being configured to amplify a differential signal between a signal generated at the cathode of the first diode and a signal generated at the cathode of the second diode, the non-inverting output being configured to output an amplified differential signal;
    a feedback capacitive element electrically connected between the inverting input and the non-inverting output of the operational amplifier; and
    a differential amplifier provided between the operational amplifier and the first input terminal and the second input terminal, the differential amplifier including a bipolar transistor pair amplifying the two input signals,
    wherein the first and second bias current sources include a current mirror circuit.

2. The amplifier according to claim 1, further comprising a low pass filter provided downstream of the first input terminal and the second input terminal, and upstream of the first diode and the second diode.

3. The amplifier according to claim 2,
    wherein the low pass filter includes a first resistive element, a second resistive element, and a capacitive element,
    the first input terminal is electrically connected to the first diode via the first resistive element,
    the second input terminal is electrically connected to the second diode via the second resistive element, and
    the capacitive element is connected between one end of the first resistive element on the first diode side and one end of the second resistive element on the second diode side.

4. The amplifier according to claim 2,
    wherein the current mirror circuit is configured to generate a control signal, and
    wherein the current supplied by the first bias current source and the current supplied by the second bias current source are adjusted in accordance with the control signal.

5. The amplifier according to claim 4,
    wherein the current mirror circuit includes a first current mirror circuit, a second current mirror circuit, and a third current mirror circuit,
    the first current mirror circuit outputs a first output current having a magnitude of 1/P (P is a real number equal to or greater than 1) with respect to a first input current,
    the second current mirror circuit outputs a second output current having a magnitude of 1/Q (Q is a real number equal to or greater than 1) with respect to a second input current,
    the third current mirror circuit outputs a third output current having a magnitude of 1/R (R is a real number equal to or greater than 1) with respect to a third input current, and
    the current supplied by the first bias current source and the current supplied by the second bias current source are set to be 1/(P×Q×R) times a magnitude of the first input current by configuring the current mirror circuit so that the first output current is identical to the second input current and the second output current is identical to the third input current.

6. The amplifier according to claim 1,
    wherein when the non-inverting input receives a decreasing voltage and the inverting input concurrently receives an increasing voltage, the non-inverting output outputs a decreasing voltage, and when the non-inverting input receives an increasing voltage and the inverting input concurrently receives a decreasing voltage, the non-inverting output outputs an increasing voltage.

7. The amplifier according to claim 6,
    wherein the operational amplifier further includes an inverting output, and amplifies a differential signal input to the non-inverting input and the inverting input and outputs the amplified differential signal from the non-inverting output and the inverting output.

8. The amplifier according to claim 1,
    wherein electrical characteristics of the first diode are set to be substantially identical to electrical characteristics of the second diode, and
    a magnitude of the current supplied by the first bias current source is set to be substantially identical to a magnitude of the current supplied by the second bias current source.

9. The amplifier according to claim 1,
    wherein the differential amplifier includes two bipolar transistors constituting a transistor pair, a resistive element, and a constant current source,
    the transistor pair is electrically connected to a first supply line for applying a first supply voltage via the resistive element, and is electrically connected to a second supply line for applying a second supply voltage via the constant current source, and
    the first supply voltage is set to be higher than the second supply voltage.

10. The amplifier according to claim 9, wherein the first supply voltage is set to a positive value and the second supply voltage is set to a ground potential.

\* \* \* \* \*